(12) United States Patent
Bian

(10) Patent No.: US 11,538,872 B2
(45) Date of Patent: Dec. 27, 2022

(54) DISPLAY STRUCTURE, DISPLAY PANEL USING THE SAME AND DISPLAY DEVICE USING THE SAME

(71) Applicant: Beijing Xiaomi Mobile Software Co., Ltd., Beijing (CN)

(72) Inventor: Qingfang Bian, Beijing (CN)

(73) Assignee: Beijing Xiaomi Mobile Software Co., Ltd., Beijing (CN)

(*) Notice: Subject to any disclaimer, the term of this patent is extended or adjusted under 35 U.S.C. 154(b) by 78 days.

(21) Appl. No.: 16/577,274

(22) Filed: Sep. 20, 2019

(65) Prior Publication Data

US 2020/0098837 A1    Mar. 26, 2020

(30) Foreign Application Priority Data

Sep. 21, 2018    (CN) .......................... 201811109264.5

(51) Int. Cl.
*H01L 27/32* (2006.01)
*G09G 3/20* (2006.01)
(Continued)

(52) U.S. Cl.
CPC ....... *H01L 27/3234* (2013.01); *G09G 3/2003* (2013.01); *G09G 3/3225* (2013.01);
(Continued)

(58) Field of Classification Search
CPC ............. H01L 27/3234; H01L 27/3248; H01L 27/3262; H01L 27/3265; H01L 27/3276;
(Continued)

(56) References Cited

U.S. PATENT DOCUMENTS 7,180,495 B1   2/2007  Matsueda
8,253,323 B2 * 8/2012  Sung ................... H01L 27/3211
                                                       313/504
(Continued)

FOREIGN PATENT DOCUMENTS

CN        102252225 A     11/2011
CN        104091561 A     10/2014
(Continued)

OTHER PUBLICATIONS

Extended European Search Report dated Feb. 6, 2020 in Patent Application No. 19194871.0, 11 pages.
(Continued)

*Primary Examiner* — Mary A Wilczewski
*Assistant Examiner* — Tsz K Chiu
(74) *Attorney, Agent, or Firm* — Oblon, McClelland, Maier & Neustadt, L.L.P.

(57) ABSTRACT

The present disclosure relates to a display structure, a display panel including the display structure, and a display device including the display panel and an image acquisition device. The display structure includes a plurality of pixels disposed in a first region of the display structure, wherein each pixel of the plurality of pixels includes a plurality of sub-pixels of N number of colors, and each sub-pixel of the plurality of sub-pixels includes an organic light emitting diode; and N number of driving circuits disposed in a second region of the display structure, wherein an $i^{th}$ driving circuit of the N number of driving circuits is configured to drive each sub-pixel of an $i^{th}$ color of the plurality of sub-pixels, wherein $1 \leq i \leq N$ and N is an integer greater than 1.

7 Claims, 7 Drawing Sheets

(51) Int. Cl.
  *G09G 3/3225* (2016.01)
  *G09G 3/3266* (2016.01)
  *H01L 27/12* (2006.01)

(52) U.S. Cl.
  CPC ....... *G09G 3/3266* (2013.01); *H01L 27/3218* (2013.01); *H01L 27/3248* (2013.01); *H01L 27/3262* (2013.01); *H01L 27/3265* (2013.01); *H01L 27/3276* (2013.01); *G09G 2300/0408* (2013.01); *G09G 2300/0426* (2013.01); *H01L 27/124* (2013.01); *H01L 27/1255* (2013.01)

(58) Field of Classification Search
  CPC ............... H01L 27/124; H01L 27/1255; H01L 27/3244; H01L 27/3218; G09G 3/3266; G09G 3/2003; G09G 2300/0408; G09G 2300/0426; G09G 2300/0443; G09G 3/3233
  See application file for complete search history.

(56) References Cited

U.S. PATENT DOCUMENTS

| | | | |
|---|---|---|---|
| 9,478,586 B2* | 10/2016 | Lee | H01L 27/3218 |
| 2002/0180369 A1* | 12/2002 | Koyama | H05B 33/14 |
| | | | 315/169.1 |
| 2004/0233140 A1 | 11/2004 | Jo | |
| 2004/0256996 A1* | 12/2004 | Osame | H01L 27/3248 |
| | | | 315/169.1 |
| 2005/0007322 A1* | 1/2005 | Adachi | H01L 27/3248 |
| | | | 345/82 |
| 2005/0168491 A1* | 8/2005 | Takahara | G09G 3/3241 |
| | | | 345/690 |
| 2006/0267885 A1* | 11/2006 | Kwak | G09G 3/3233 |
| | | | 345/76 |
| 2007/0001953 A1* | 1/2007 | Jang | G09G 3/3677 |
| | | | 345/88 |
| 2007/0013647 A1* | 1/2007 | Lee | G09G 3/3426 |
| | | | 345/102 |
| 2008/0165267 A1 | 7/2008 | Cok | |
| 2010/0025664 A1* | 2/2010 | Park | H01L 27/326 |
| | | | 257/40 |
| 2017/0294155 A1* | 10/2017 | Kim | H01L 27/3248 |
| 2021/0158746 A1* | 5/2021 | Li | G09G 3/3225 |

FOREIGN PATENT DOCUMENTS

| | | |
|---|---|---|
| CN | 104464602 A | 3/2015 |
| CN | 106444196 A | 2/2017 |
| CN | 107275361 A | 10/2017 |
| CN | 107610635 A | 1/2018 |
| EP | 1 146 501 A1 | 10/2001 |

OTHER PUBLICATIONS

Combined Chinese Office Action and Search Report dated May 20, 2022, in corresponding Chinese Patent Application No. 201811109264.5 (with English Translation), 17 pages.

* cited by examiner

DISPLAY STRUCTURE, DISPLAY PANEL USING THE SAME AND DISPLAY DEVICE USING THE SAME

CROSS-REFERENCE TO RELATED APPLICATIONS

This application is based on and claims priority to Chinese Patent Application No. 201811109264.5, filed on Sep. 21, 2018, the entire contents of which are incorporated herein by reference.

TECHNICAL FIELD

The present disclosure relates to the field of display technology, and more particularly to a display structure, a display panel using the display structure and a display device using the display panel.

BACKGROUND

In order to improve the intelligence of mobile terminals, more and more functions are integrated into smart terminals, such as the function of taking photos. In order to attain the function of taking photos, an image acquisition device must be integrated into the smart terminal. In order to enable the image acquisition device to acquire images from the front of the mobile terminal, an opening (e.g., hole) is made on the front of the mobile terminal for disposing the image acquisition device. This adversely affects the appearance of the mobile terminal and reduces the area ratio of the display region on the front of the mobile terminal.

SUMMARY

This Summary is provided to introduce a selection of aspects of the present disclosure in a simplified form that are further described below in the Detailed Description. This Summary is not intended to identify key features or essential features of the claimed subject matter, nor is it intended to be used to limit the scope of the claimed subject matter.

Aspects of the disclosure provide a display structure. The display structure includes a plurality of pixels disposed in a first region of the display structure, wherein each pixel of the plurality of pixels includes a plurality of sub-pixels of N number of colors, and each sub-pixel of the plurality of sub-pixels includes an organic light emitting diode; and N number of driving circuits disposed in a second region of the display structure, wherein an $i^{th}$ driving circuit of the N number of driving circuits is configured to drive each sub-pixel of an $i^{th}$ color of the plurality of sub-pixels, wherein $1 \leq i \leq N$ and N is an integer greater than 1.

According to an aspect, each of the N number of driving circuits includes a driving transistor, wherein the organic light emitting diode of each of the plurality of sub-pixels includes a first electrode, a second electrode, and an organic light emitting layer disposed between the first electrode and the second electrode, and wherein a driving transistor of the $i^{th}$ driving circuit is connected to the first electrode of the organic light emitting diode of each respective sub-pixel of the plurality of sub-pixels of the $i^{th}$ color.

According to another aspect, the first electrodes of adjacent same color sub-pixels are connected to each other.

According to yet another aspect, each driving circuit of the N number of driving circuits includes a switching transistor, wherein a first terminal of the switching transistor is connected to a scanning line, and a second terminal of the switching transistor is connected to a data line; a driving transistor, wherein a first terminal of the driving transistor is connected to a third terminal of the switching transistor, a second terminal of the driving transistor is connected to a preset voltage, and a third terminal of the driving transistor is connected to the organic light emitting diode; and a capacitor, wherein a first terminal of the capacitor is connected to the first terminal of the driving transistor, and a second terminal of the capacitor is connected to the second terminal of the driving transistor.

Aspects of the disclosure also provide a display panel. The display panel includes a display structure and an effective light emitting region. The display structure includes a plurality of pixels disposed in a first region of the display structure, wherein each pixel of the plurality of pixels includes a plurality of sub-pixels of N number of colors, and each sub-pixel of the plurality of sub-pixels includes an organic light emitting diode; and N number of driving circuits disposed in a second region of the display structure, wherein an $i^{th}$ driving circuit of the N number of driving circuits is configured to drive each sub-pixel of an $i^{th}$ color of the plurality of sub-pixels, wherein $1 \leq i \leq N$, and N is an integer greater than 1. The effective light emitting region includes a plurality of effective light emitting pixels and a plurality of driving circuits disposed in the effective light emitting region, wherein each of the plurality of effective light emitting pixels includes a plurality of sub-pixels, and each of the plurality of sub-pixels in the effective light emitting region corresponds to a respective one of the plurality of driving circuits.

According to an aspect, the display panel also includes a gate driving circuit configured to input a gate driving signal to each of the plurality of driving circuits; and a data signal circuit configured to input a data signal to each of the plurality of driving circuits.

According to an aspect, the display panel also includes an array substrate, wherein the gate driving circuit is disposed on the array substrate.

Aspects of the disclosure also provide a display device. The display device includes a display panel and an image acquisition device. The display panel includes a display structure and an effective light emitting region. The display structure includes a plurality of pixels disposed in a first region of the display structure, wherein each pixel of the plurality of pixels includes a plurality of sub-pixels of N number of colors, and each sub-pixel of the plurality of sub-pixels includes an organic light emitting diode; and N number of driving circuits disposed in a second region of the display structure, wherein an $i^{th}$ driving circuit of the N number of driving circuits is configured to drive each sub-pixel of an $i^{th}$ color of the plurality of sub-pixels, wherein $1 \leq i \leq N$, and N is an integer greater than 1. The effective light emitting region includes a plurality of effective light emitting pixels and a plurality of driving circuits disposed in the effective light emitting region, wherein each of the plurality of effective light emitting pixels includes a plurality of sub-pixels, and each of the plurality of sub-pixels in the effective light emitting region corresponds to a respective one of the plurality of driving circuits. The image acquisition device is disposed in the first region and is located on a side of the display structure away from a light exiting direction.

According to an aspect, the display device also includes a sensor disposed in the first region and located on the side of the display structure away from the light exiting direction.

It is to be understood that both the foregoing general description and the following detailed description are illustrative and explanatory only and are not restrictive of the present disclosure.

BRIEF DESCRIPTION OF THE DRAWINGS

The accompanying drawings, which are incorporated in and constitute a part of this specification, illustrate aspects consistent with the disclosure and, together with the description, serve to explain the principles of the disclosure.

The specific aspects of the present disclosure, which have been illustrated by the accompanying drawings described above, will be described in detail below. These accompanying drawings and description are not intended to limit the scope of the present disclosure in any manner, but to explain the concept of the present disclosure to those skilled in the art via referencing specific aspects.

DETAILED DESCRIPTION

Reference will now be made in detail to exemplary aspects, examples of which are illustrated in the accompanying drawings. The following description refers to the accompanying drawings in which the same numbers in different drawings represent the same or similar elements unless otherwise represented. The implementations set forth in the following description of illustrative aspects do not represent all implementations consistent with the disclosure. Instead, they are merely examples of apparatuses and methods consistent with aspects related to the disclosure as recited in the appended claims.

Figure 1:
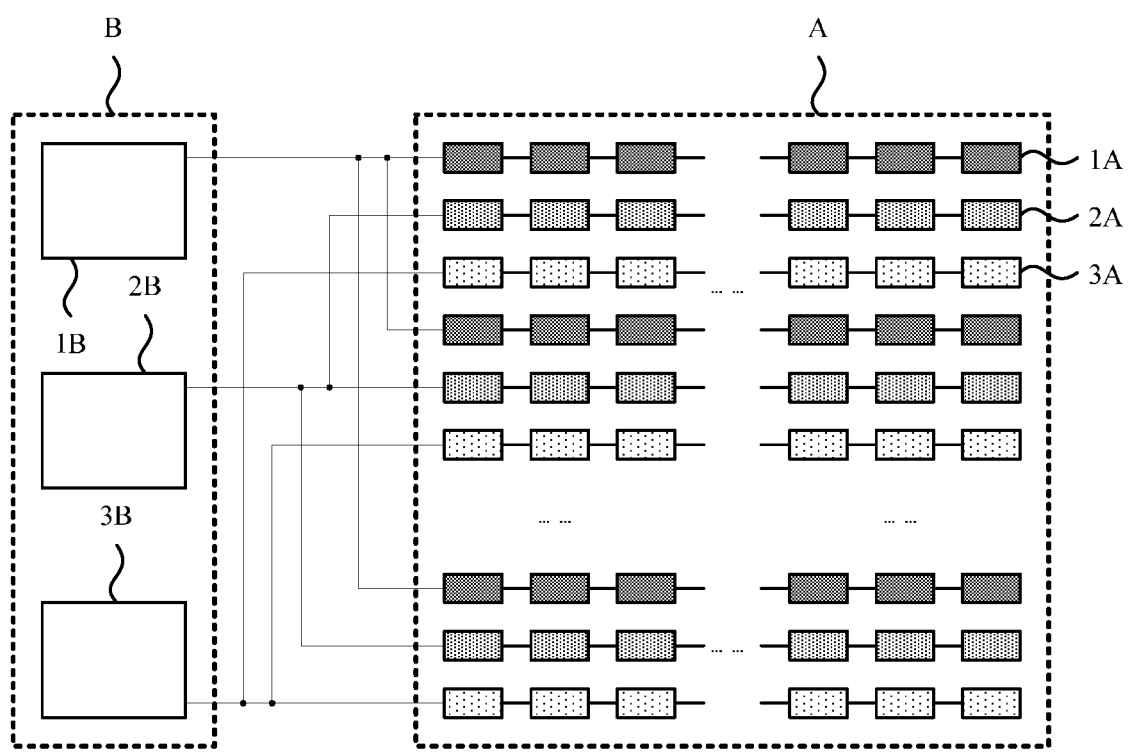
FIG. 1 is a schematic diagram of a display structure shown in accordance with an exemplary aspect of the present disclosure.
Figure 2:
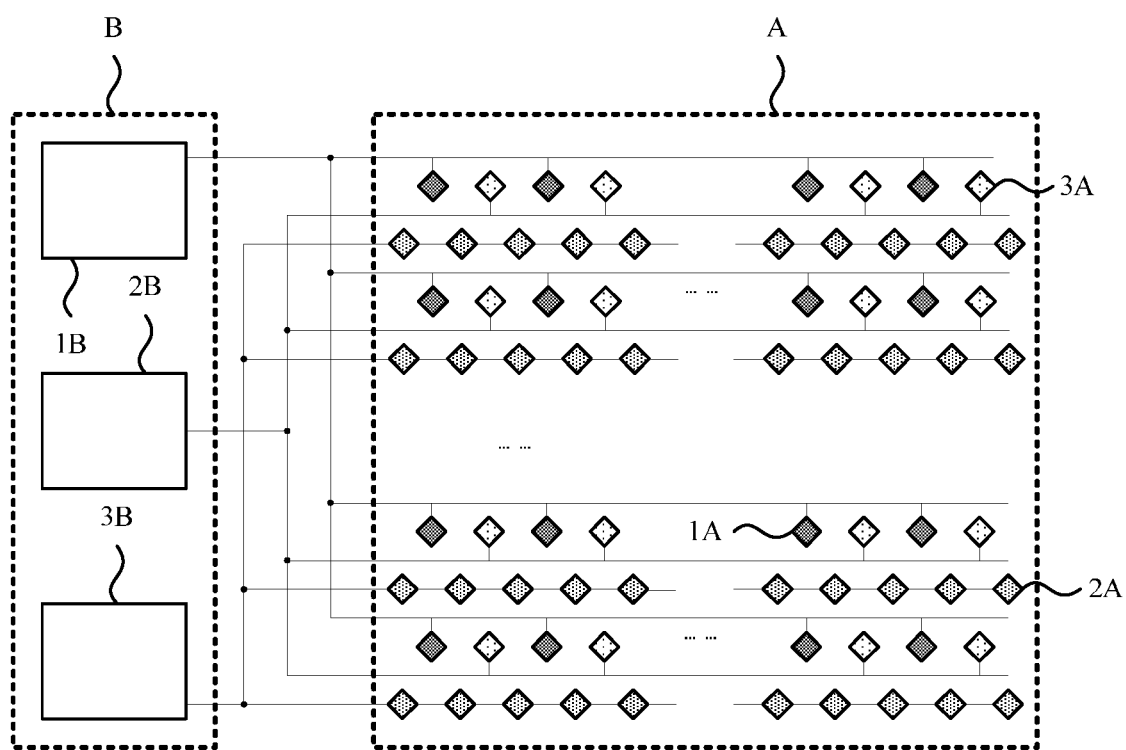
FIG. 2 is a schematic diagram of a display structure shown in accordance with another exemplary aspect of the present disclosure.

FIG. 1 is a schematic diagram of a display structure shown in accordance with an embodiment of the present disclosure, and FIG. 2 is a schematic diagram of a display structure shown in accordance with another embodiment of the present disclosure. As shown in FIGS. 1 and 2, each of the display structures includes:

a plurality of pixels, disposed in a first region A of the display structure, wherein each pixel includes n colors of sub-pixels, and each of the sub-pixels includes an organic light emitting diode; and n driving circuits, disposed in a second region B of the display structure, wherein the $i^{th}$ driving circuit is configured to drive each sub-pixel of the $i^{th}$ color, $1 \leq i \leq n$, and n is an integer greater than 1.

In one embodiment, n=3 is taken as an example, that is, each pixel includes three colors of sub-pixels, for example, the three colors are red, green and blue respectively, wherein the red sub-pixel 1A, green sub-pixel 2A and blue sub-pixel 3A may be arranged in a matrix as shown in FIG. 1, in this case, each pixel includes three sub-pixels respectively corresponding to the above three colors. Alternatively, the sub-pixels may be arranged in a crystal form as shown in FIG. 2, in which case, each pixel includes one red sub-pixel 1A, one blue sub-pixel 3A and two green sub-pixels 2A.

It should be noted that the sub-pixels included in each pixel are not limited to those described in the above embodiments, and the arrangement of the sub-pixels is not limited to the case described in the above embodiments either.

According to the embodiment of the present disclosure, since the driving circuit contains light blocking structures such as transistors, capacitors, or the like, while the organic light emitting diode is transparent, the display structure of the first region is nearly transparent by disposing the sub-pixels in the first region and disposing the driving circuits in the second region, and the sub-pixels of different colors are respectively driven by different driving circuits, so that the display structure of the first region can have a display function to some extent, for example, can display different colors.

According to the above, in a display device including the display structure, if it needs to dispose an image acquisition device in the display device, the image acquisition device can be disposed under the first region of the display structure. Since the first region is nearly transparent, it can be ensured that the image acquisition device cannot be blocked, and the first region still has a certain display effect, so it belongs to a part of the display region as well, which is advantageous for increasing the proportion of display region on the front of the display device and making the display device appear more beautiful as a whole.

Optionally, the driving circuit includes a driving transistor, and the organic light emitting diode includes a first electrode, a second electrode and an organic light emitting layer disposed between the first electrode and the second electrode;

wherein the driving transistor in the $i^{th}$ driving circuit is connected to the first electrode of each sub-pixel of the $i^{th}$ color.

In one embodiment, the structure of the organic light emitting diode may be configured to have an organic light emitting layer disposed between the first electrode and the second electrode, wherein the first electrode is an anode and the second electrode is a cathode, or the first electrode is the cathode and the second electrode is the anode. The following mainly exemplifies the case where the first electrode is the anode and the second electrode is the cathode.

For different organic light emitting diodes, the first electrode is disposed on the same side of the organic light emitting diodes. Therefore, by connecting the driving transistor to the plurality of first electrodes to realize the driving of the plurality of sub-pixels, the structure is relatively simple in comparison with the structure that the driving transistor is connected to the first electrodes of a portion of the sub-pixels and to the second electrodes of another portion of the sub-pixels.

Figure 3:
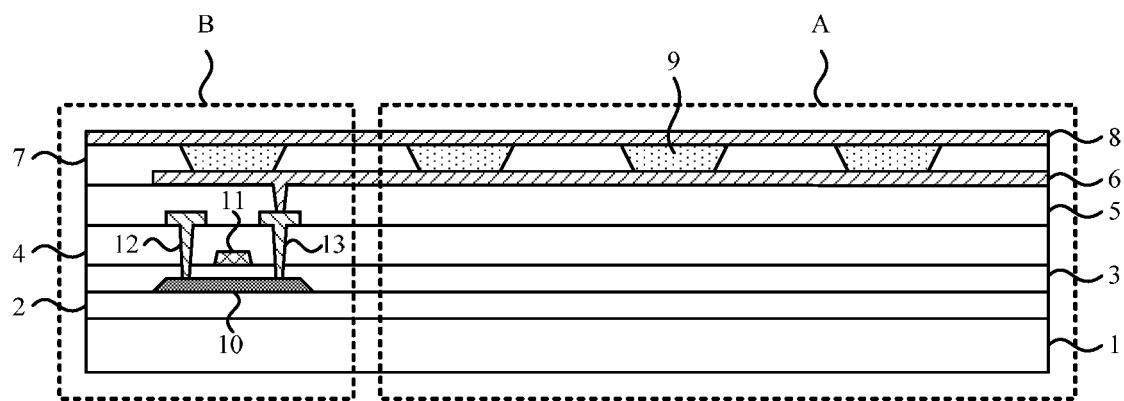
FIG. 3 is a schematic cross-sectional view of a display structure shown in accordance with an exemplary aspect of the present disclosure.
Figure 4:
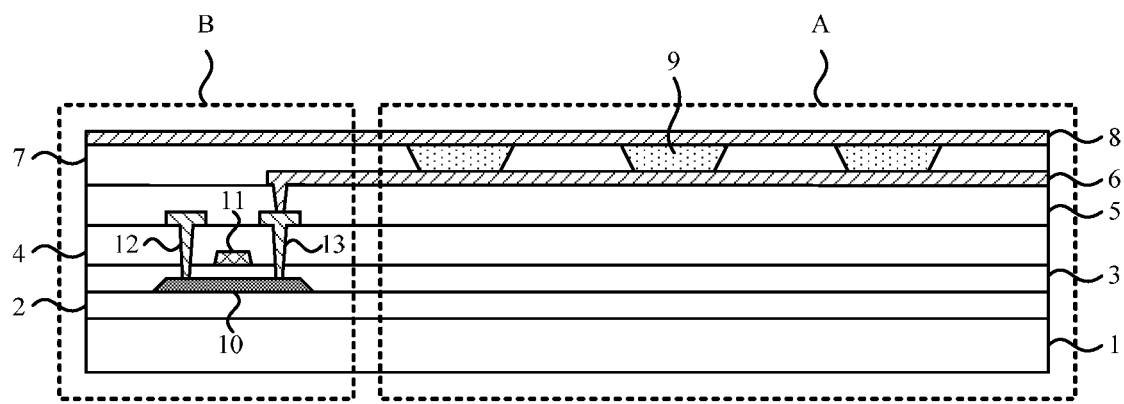
FIG. 4 is a schematic cross-sectional view of a display structure shown in accordance with another exemplary aspect of the present disclosure.

FIG. 3 is a schematic cross-sectional view of a display structure shown in accordance with an embodiment of the present disclosure, and FIG. 4 is a schematic cross-sectional view of a display structure shown in accordance with another embodiment of the present disclosure. As shown in FIGS. 3 and 4, the first electrodes 6 of adjacent same color sub-pixels are connected to each other.

In one embodiment, as shown in FIG. 3, the display structure, from bottom to top, may sequentially include a substrate 1, a buffer layer 2, a gate insulating layer 3, an interlayer dielectric layer 4, a flat layer 5, a first electrode 6, a pixel defining layer 7 and a second electrode 8. The driving transistor includes an active layer 10, a gate electrode 11, a source electrode 12 and a drain electrode 13. An organic material layer 9 is disposed between the first electrode 6 and the second electrode 8.

Each block of organic material layer 9 corresponds to one sub-pixel, and the first electrodes 6 of a plurality of sub-pixels of the same color are connected to each other. According to the above, when the first electrodes 6 are formed, the first electrodes 6 can be connected to each other, and thus the plurality of same color sub-pixels are connected to each other. By connecting the driving transistor with the first electrode 6 of any one of the sub-pixels, a structure that the driving transistor is connected to the first electrode 6 of the sub-pixels can be formed, which is advantageous for simplifying the connection structure between the driving transistor and the first electrode 6.

The driving transistor may be connected to the plurality of same color sub-pixels in other manners. For example, in a case where the first electrodes of the same color sub-pixel are not connected to each other, a via-hole may be disposed at a position corresponding to the first electrode of each sub-pixel, and then the drain electrode of the driving transistor is extended to each via-hole, thereby realizing the electrical connection to the first electrode in each via-hole.

It should be noted that, in the embodiment shown in FIG. 3, the organic material layer 9 may be disposed above the driving transistor, that is, the second region B where the driving circuits are located may emit light as well. No organic material layer may be disposed above the driving transistor if such is needed, as shown in FIG. 4, so that the second region B where the driving circuits are located does not emit light.

Figure 5:
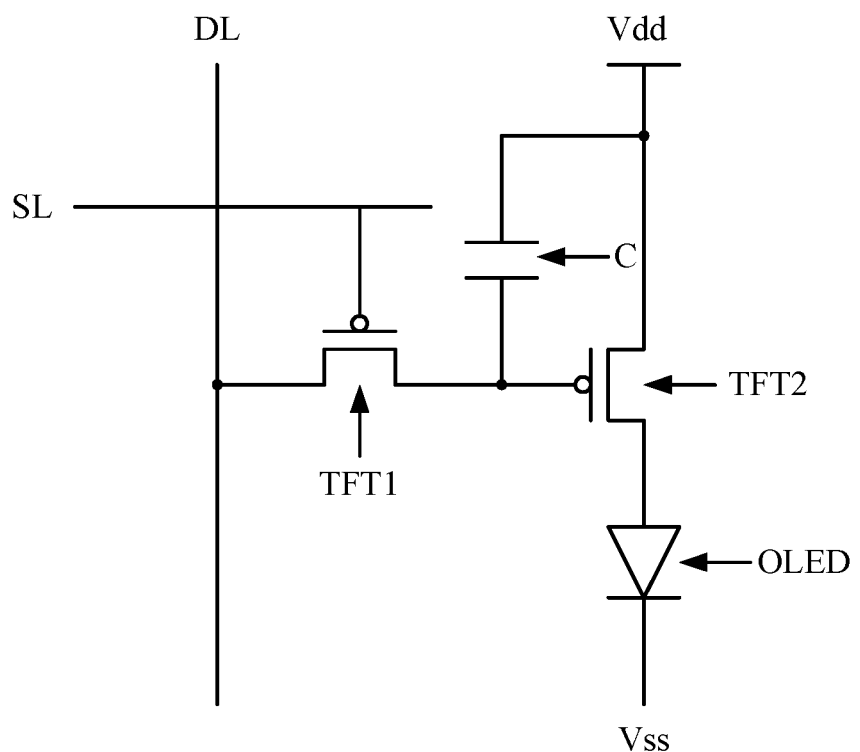
FIG. 5 is a schematic diagram of a driving circuit shown in accordance with an exemplary aspect of the present disclosure.

FIG. 5 is a schematic diagram of a driving circuit shown in accordance with an embodiment of the present disclosure. As shown in FIG. 5, the driving circuit includes:

a switching transistor TFT1, a first terminal of the switching transistor TFT1 is connected to a scanning line SL, and a second terminal of the switching transistor TFT1 is connected to a data line DL;

a driving transistor TFT2, a first terminal of the driving transistor TFT2 is connected to a third terminal of the switching transistor TFT1, a second terminal of the driving transistor TFT2 is connected to a preset voltage Vdd, and a third terminal of the driving transistor TFT2 is connected to the organic light emitting diode OLED; and a capacitor C, a first terminal of the capacitor C is connected to the first terminal of the driving transistor TFT2, and a second terminal of the capacitor C is connected to the second terminal of the driving transistor TFT2.

In one embodiment, the above described first terminal may refer to a gate electrode, the second terminal may refer to a source electrode, and the third terminal may refer to a drain electrode. The scanning line SL may input a signal to the gate electrode of the switching transistor TFT1 such that the switching transistor TFT1 is turned on, and then the signal on the data line DL is transmitted to the drain electrode of the switching transistor TFT1 through its source electrode, and is applied to the gate electrode of the driving transistor TFT2, so that the driving transistor TFT2 is turned on. The signal of the preset voltage Vdd generates a current through the driving transistor TFT2 and input it to the organic light emitting diode OLED, such that the organic light emitting diode OLED emits light.

It should be noted that the structure of the driving circuit is not limited to the case in the embodiment shown in FIG. 5. For example, a structure or a process such as 6T1C, 7T1C or NMOS, CMOS may be employed as well.

Figure 6:
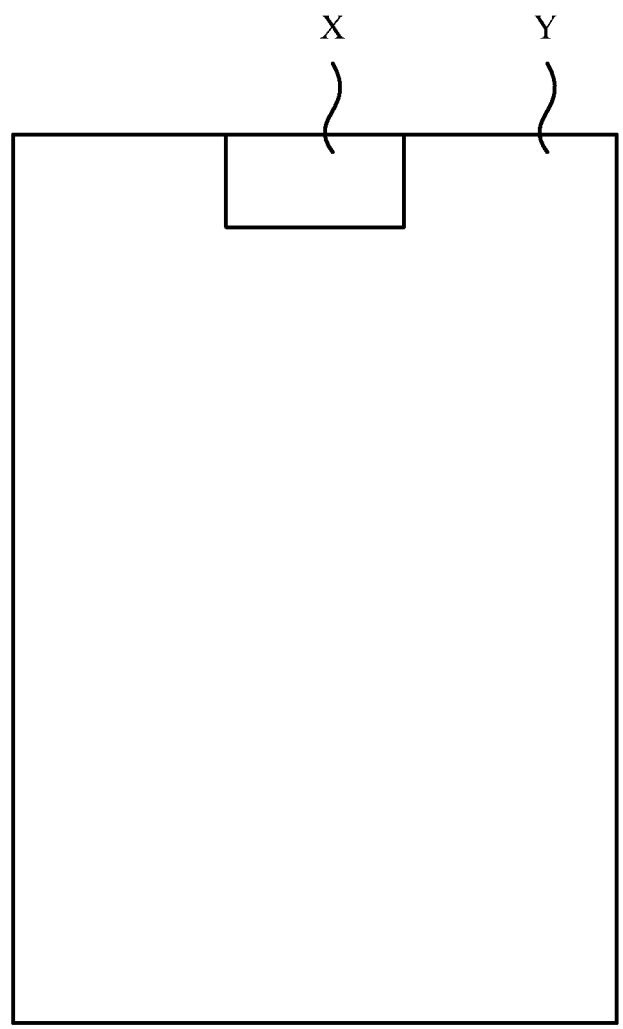
FIG. 6 is a schematic diagram of a display panel shown in accordance with an exemplary aspect of the present disclosure.

FIG. 6 is a schematic diagram of a display panel shown in accordance with an embodiment of the present disclosure. As shown in FIG. 6, a display panel, includes the display structure X of any of the above embodiments, and further includes:

an effective light emitting region Y, wherein a plurality of effective light emitting pixels and a plurality of driving circuits are disposed in the effective light emitting region Y, each effective light emitting pixel includes a plurality of sub-pixels, and the sub-pixels in the effective light emitting region Y correspond to a driving circuits one by one.

In one embodiment, in the effective light emitting region of the display panel, since each sub-pixel corresponds to a driving circuit one by one, for example, the driving transistor is disposed under the organic light emitting layer of the sub-pixel, such that each sub-pixel can be separately controlled, thereby realizing that the pattern can be displayed in the effective light emitting region.

In this case, if it needs to dispose an image acquisition device under the display panel, the image acquisition device can be disposed under the first region of the display structure, and since the first region is nearly transparent, and has a certain display effect, the effective light emitting region and the first region of the display structure together can function as the display region, so that the region in which the image acquisition device is disposed can be used as the display region as well, which is advantageous for increasing the proportion of display region on the front of the display panel and making the display panel appear more beautiful as a whole.

It should be noted that, in the embodiment shown in FIG. 3, the organic material layer 9 may be disposed above the driving transistor, that is, the second region B where the driving circuits are located may emit light as well. In this case, the driving transistor in the display structure and the driving transistor of the driving circuit in the effective light emitting region can be used at the same time.

In the case of the embodiment shown in FIG. 4, no organic material layer is disposed above the driving transistor, and then the driving transistor in the display structure can be disposed in the frame region of the display panel, thereby avoiding that the driving transistor affects the transmittance of the display panel.

In one embodiment, based on the embodiment shown in FIG. 6, the display structure includes:

a plurality of pixels, disposed in a first region of the display structure, wherein each pixel includes n colors of sub-pixels, and the sub-pixel includes an organic light emitting diode; and n driving circuits, disposed in a second region of the display structure, wherein the $i^{th}$ driving circuit is configured to drive each sub-pixel of the $i^{th}$ color, $1 \leq i \leq n$, and n is an integer greater than 1.

In one embodiment, the driving circuit includes a driving transistor, and the organic light emitting diode includes a first electrode, a second electrode, and an organic light emitting layer disposed between the first electrode and the second electrode;

wherein the driving transistor in the $i^{th}$ driving circuit is connected to a first electrode of each sub-pixel of the $i^{th}$ color.

In one embodiment, the first electrodes of adjacent same color sub-pixels are connected to each other.

In one embodiment, the driving circuit includes:

a switching transistor, wherein a first terminal of the switching transistor is connected to a scanning line, and a second terminal of the switching transistor is connected to a data line;

a driving transistor, wherein a first terminal of the driving transistor is connected to a third terminal of the switching transistor, a second terminal of the driving transistor is connected to a preset voltage, and a third terminal of the driving transistor is connected to the organic light emitting diode; and a capacitor, wherein a first terminal of the capacitor is connected to the first terminal of the driving transistor, and a second terminal of the capacitor is connected to the second terminal of the driving transistor.

Optionally, the display panel further includes:

a gate driving circuit, configured to input a gate driving signal to the driving circuit; and a data signal circuit, configured to input a data signal to the drive circuit.

The driving circuit includes the driving circuit in the display structure, and includes the driving circuit in the effective light emitting region as well.

In one embodiment, the gate driving circuit can input a gate driving signal to the driving circuit through the scanning line. For the n driving circuits in the display structure, the gate driving signal can be input to the n driving circuits through one scanning line, or the gate driving signal can be input to the n driving circuits through n scanning lines in a one-to-one correspondence as well. In addition, the gate driving signal can be input to the a driving circuits of the n driving circuits through one scanning line, and the gate driving signal can be input to the n-a driving circuits of the n driving circuits through n-a scanning lines in a one-to-one correspondence, wherein a is a positive integer smaller than n.

For the driving circuit in the effective light-emitting region of the above display panel, the gate driving signal may be input through the scanning line. The scanning line, through which the gate driving signal may be input to the driving circuit in the effective light-emitting region of the display panel, may be multiplexed to input the gate driving signal to the driving circuit in the above display structure.

The scanning line through which the gate driving signal may be input to the driving circuit in the effective light-emitting region of the display panel, and the scanning line through which the gate driving signal may be input to the driving circuit in the above display structure, may be different. For example, the gate driving signal is input to the driving circuit in the display structure through one scanning line, and the gate driving signal is input to the driving circuit in the effective light emitting region of the display panel through m scanning lines. The scanning line, through which the gate driving signal is input to the driving circuit in the above display structure, can be placed at any position in the m+1 scanning lines, for example, in the first row or in the $(m+1)^{th}$ row.

Optionally, the display panel further includes:

an array substrate, wherein the gate driving circuit is disposed on the array substrate.

In one embodiment, the gate driving circuit (Gate IC) may be disposed on the array substrate to form a GOA (Gate IC On Array) structure.

The embodiment of the present disclosure further provides a display device that includes the display panel of any of the above embodiments and further includes:

an image acquisition device, disposed in the first region and located on a side of the display structure away from the light exiting direction.

In one embodiment, the image acquisition device can be disposed under the display panel, specifically in the first region of the display structure and on a side of the display structure away from the light exiting direction. Since the first region is nearly transparent, and has a certain display effect, the effective light emitting region and the first region of the display structure together can function as the display region, so that the region in which the image acquisition device is disposed can be used as the display region as well, which is advantageous for increasing the proportion of display region on the front of the display device and making the display device appear more beautiful as a whole.

Optionally, the display device further includes:

a sensor, disposed in the first region and located on a side of the display structure away from the light exiting direction.

In one embodiment, if it needs to dispose the sensor in the display device, the sensor may be disposed in the first region of the display structure and located on the side of the display structure away from the light exiting direction as well, so that the region where the sensor is disposed can be used as the display region as well, which is advantageous for increasing the proportion of display region on the front of the display device and making the display device appear more beautiful as a whole. Wherein, the sensor may include a distance sensor, an ambient light sensor, or the like.

It should be noted that the display device may be a mobile terminal, such as a mobile phone, a tablet computer, a smart wearable device, etc., or may be other types of devices, such as a television, a computer screen, or the like.

Figure 7:
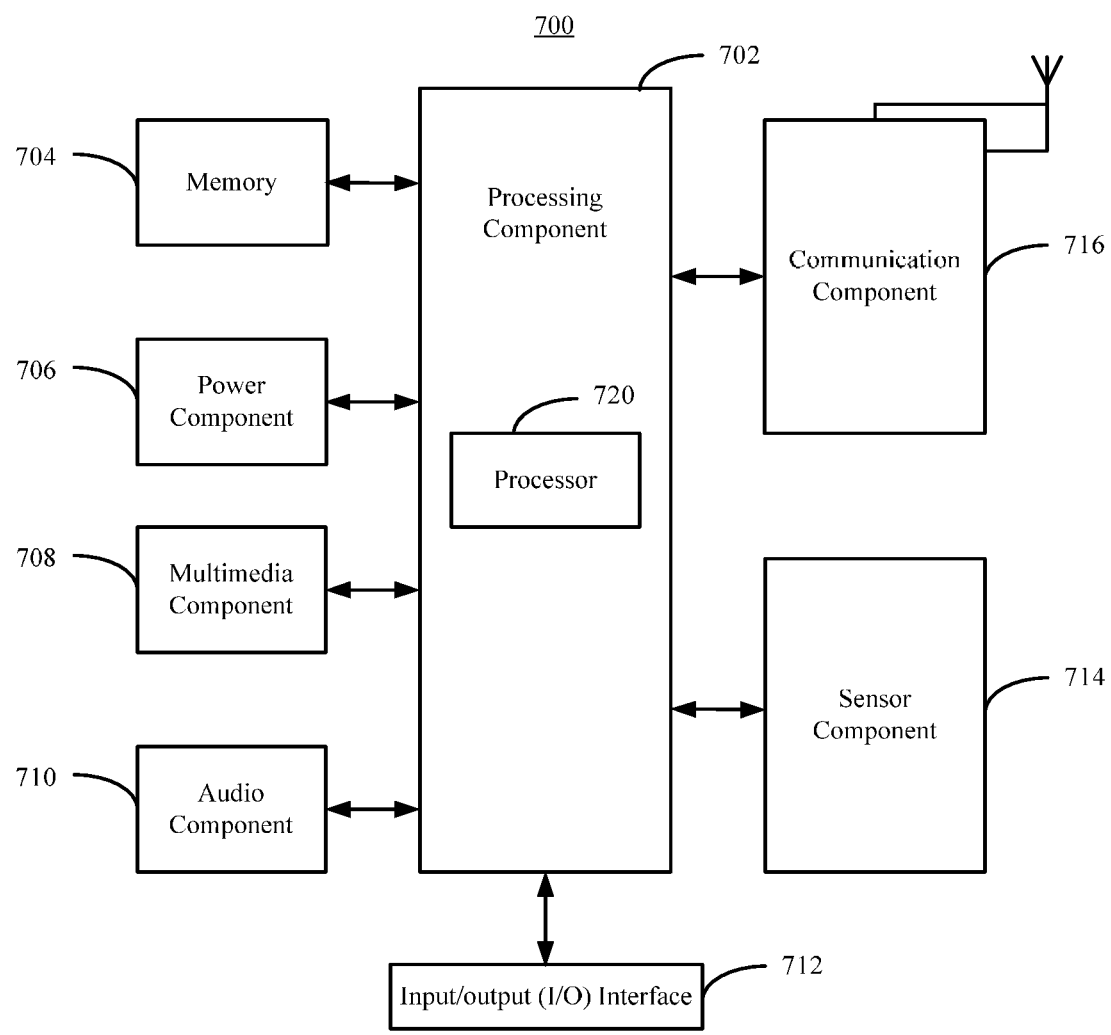
FIG. 7 is a schematic block diagram of a device for display shown in accordance with an exemplary aspect of the present disclosure.

FIG. 7 is a schematic block diagram of a device 700 for display shown in accordance with an embodiment of the present disclosure. For example, device 700 can be a mobile phone, a computer, a digital broadcast terminal, a message transceiver, a gaming console, a tablet device, a medical device, a fitness device, a personal digital assistant, or the like.

Referring to FIG. 7, the device 700 may include one or more of the following components: a processing component 702, a memory 704, a power component 706, a multimedia component 708, an audio component 710, an input/output (I/O) interface 712, a sensor component 714, and a communication component 716. The device 700 further includes the display panel of any of the above embodiments.

The processing component 702 typically controls the overall operations of the device 700, such as the operations associated with display, telephone call, data communication, camera operation and recording operation. The processing component 702 can include one or more processors 720 to execute instructions to perform all or part of the steps in the above described methods. Moreover, the processing component 702 can include one or more modules to facilitate the interaction between the processing component 702 and other components. For example, the processing component 702 can include a multimedia module to facilitate the interaction between the multimedia component 708 and the processing component 702.

The memory 704 is configured to store various types of data to support the operation of the device 700. Examples of such data include instructions for any application or method operated on device 700, such as the contact data, the phone book data, messages, pictures, videos, and the like. The memory 704 can be implemented by any type of volatile or non-volatile storage device, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk or optical disk.

The power component 706 provides power to the respective components of the device 700. The power component 706 can include a power management system, one or more power sources, and other components associated with the generation, management, and distribution of power in the device 700.

The multimedia component 708 includes a screen providing an output interface between the device 700 and the user. In some embodiments, the screen can include a liquid crystal display (LCD) and a touch panel (TP). If the screen includes the touch panel, the screen can be implemented as a touch screen to receive input signals from the user. The touch panel includes one or more touch sensors to sense touches, swipes, and gestures on the touch panel. The touch sensors may not only sense a boundary of a touch or swipe action, but further sense a period of time and a pressure associated with the touch or swipe action. In some embodiments, the multimedia component 708 includes a front camera and/or a rear camera. When the device 700 is in an operation mode, such as a photographing mode or a video mode, the front camera and/or the rear camera can receive external multimedia data. Each of the front camera and the rear camera may be a fixed optical lens system or have capability of focus and optical zoom.

The audio component 710 is configured to output and/or input an audio signal. For example, the audio component 710 includes a microphone (MIC) configured to receive an external audio signal when the device 700 is in an operation mode, such as a call mode, a recording mode and a voice recognition mode. The received audio signal may be further stored in the memory 704 or transmitted via the communication component 716. In some embodiments, the audio component 710 further includes a speaker for outputting the audio signal.

The I/O interface 712 provides an interface between the processing component 702 and peripheral interface modules such as a keyboard, a click wheel, buttons, and the like. These buttons may include, but are not limited to, a home button, a volume button, a starting button and a locking button.

The sensor component 714 includes one or more sensors for providing status assessments of various aspects of the device 700. For example, the sensor component 714 can detect an open/closed status of the device 700, relative positioning of components such as the display and the keypad of the device 700. The sensor component 714 can further detect a change in position of one component of the device 700 or of the device 700, the presence or absence of user contacting with the device 700, orientation, or acceleration/deceleration of the device 700, and a change in temperature of the device 700. The sensor component 714 can include a proximity sensor configured to detect the presence of nearby objects without any physical contact. The sensor component 714 can further include a light sensor, such as a CMOS or CCD image sensor, configured to be used in imaging applications. In some embodiments, the sensor component 714 can further include an accelerometer sensor, a gyroscope sensor, a magnetic sensor, a pressure sensor or a temperature sensor.

The communication component 716 is configured to facilitate wired or wireless communication between the device 700 and other devices. The device 700 can access a wireless network based on a communication standard, such as WiFi, 2G or 3G, or a combination thereof. In an exemplary embodiment, the communication component 716 receives broadcast signals or broadcast associated information from an external broadcast management system via a broadcast channel. In an exemplary embodiment, the communication component 716 further includes a near field communication (NFC) module to facilitate short-range communications. For example, the NFC module can be implemented based on a radio frequency identification (RFID) technology, an infrared data association (IrDA) technology, an ultra-wideband (UWB) technology, a Bluetooth (BT) technology and other technologies.

In an exemplary embodiment, the device 700 may be implemented with one or more application specific integrated circuit (ASIC), digital signal processor (DSP), digital signal processing device (DSPD), programmable logic device (PLD), field programmable Gate array (FPGA), controller, microcontroller, microprocessor or other electronic component.

In an exemplary embodiment, there is further provided a non-transitory computer-readable storage medium including instructions, such as a memory 704 including instructions executable by the processor 720 of the device 700 to perform the above described method. For example, the non-transitory computer readable storage medium may be a ROM, a random access memory (RAM), a CD-ROM, a magnetic tape, a floppy disc, and an optical data storage device.

It is noted that the various modules, sub-modules, units, and components in the present disclosure can be implemented using any suitable technology. For example, a module may be implemented using circuitry, such as an integrated circuit (IC). As another example, a module may be implemented as a processing circuit executing software instructions.

Other embodiments of the present disclosure will be apparent to those skilled in the art after consideration of the specification and practice of the present disclosure disclosed herein. The present application is intended to cover any variations, uses or adaptations of the present disclosure, which are in accordance with the general principle of the present disclosure and include common general knowledge or conventional technical means in the art that are not disclosed in the present disclosure. The specification and embodiments are only illustrative, and the real scope and spirit of the present disclosure is defined by the appended claims.

It should be understood that the present disclosure is not limited to the precise structures that have been described above and shown in the drawings, and various modifications and changes can be made without departing from the scope thereof. The scope of the present disclosure is limited only by the appended claims.

What is claimed is:

1. A display structure, comprising:
a plurality of pixels disposed in a first region of the display structure, wherein each pixel of the plurality of pixels comprises a plurality of sub-pixels of N number of colors, each sub-pixel of the plurality of sub-pixels of the plurality of pixels comprises an organic light emitting diode, and all sub-pixels of an $i^{th}$ color of the plurality of sub-pixels of the plurality of pixels are connected in parallel wherein 1≤i≤N and N is an integer greater than 1; and N number of driving circuits disposed in a second region of the display structure, wherein an $i^{th}$ driving circuit of the N number of driving circuits is configured to drive all of the sub-pixels of the $i^{th}$ color of the plurality of sub-pixels of the plurality of pixels, in the first region, wherein each of the N number of driving circuits comprises a driving transistor, wherein the organic light emitting diode of each of the plurality of sub-pixels of the plurality of pixels comprises a first electrode, a second electrode, and an organic light emitting layer disposed between the first electrode and the second electrode, wherein the driving transistor of the $i^{th}$ driving circuit is connected to the first electrodes of the organic light emitting diodes of all of the sub-pixels of the $i^{th}$ color of the plurality of sub-pixels of the plurality of pixels, and wherein the organic light emitting diode is transparent, the first region and the second region do not overlap, and the first region does not contain any one of the driving circuits, such that the first region is wholly transparent.

2. The display structure according to claim 1, wherein each driving circuit of the N number of driving circuits comprises:
   a switching transistor, wherein a first terminal of the switching transistor is connected to a scanning line, and a second terminal of the switching transistor is connected to a data line;
   the driving transistor, wherein a first terminal of the driving transistor is connected to a third terminal of the switching transistor, a second terminal of the driving transistor is connected to a preset voltage, and a third terminal of the driving transistor is connected to the organic light emitting diode; and
   a capacitor, wherein a first terminal of the capacitor is connected to the first terminal of the driving transistor, and a second terminal of the capacitor is connected to the second terminal of the driving transistor.

3. A display panel, comprising:
a display structure that comprises:
   a plurality of pixels disposed in a first region of the display structure, wherein each pixel of the plurality of pixels comprises a plurality of sub-pixels of N number of colors, each sub-pixel of the plurality of sub-pixels of the plurality of pixels comprises an organic light emitting diode, and all sub-pixels of an $i^{th}$ color of the plurality of sub-pixels of the plurality of pixels are connected in parallel, wherein 1≤i≤N and N is an integer greater than 1; and
   N number of driving circuits disposed in a second region of the display structure, wherein an $i^{th}$ driving circuit of the N number of driving circuits is configured to drive all of the sub-pixels of the $i^{th}$ color of the plurality of sub-pixels of the plurality of pixels in the first region,
wherein each of the N number of driving circuits comprises a driving transistor,
wherein the organic light emitting diode of each of the plurality of sub-pixels of the plurality of pixels comprises a first electrode, a second electrode, and an organic light emitting layer disposed between the first electrode and the second electrode,
wherein the driving transistor of the $i^{th}$ driving circuit is connected to the first electrodes of the organic light emitting diodes of all of the sub-pixels of the $i^{th}$ color of the plurality of sub-pixels of the plurality of pixels,
wherein the organic light emitting diode is transparent, the first region and the second region do not overlap, and the first region does not contain any one of the driving circuits, such that the first region is wholly transparent, and
wherein the display panel further comprises an effective light emitting region comprising a plurality of effective light emitting pixels and a plurality of corresponding driving circuits disposed in the effective light emitting region, wherein each of the plurality of effective light emitting pixels includes a plurality of sub-pixels, and each of the plurality of sub-pixels in the effective light emitting region corresponds to a respective one of the plurality of corresponding driving circuits.

4. The display panel according to claim 3, further comprising:
   a gate driving circuit configured to input a gate driving signal to each of e plurality of driving circuits; and
   a data signal circuit configured to input a data signal to each of the plurality of driving circuits.

5. The display panel according to claim 4, further comprising:
   an array substrate, wherein the gate driving circuit is disposed on the array substrate.

6. A display device, comprising:
a display panel that comprises:
   a display structure that comprises:
      a plurality of pixels disposed in a first region of the display structure, wherein each pixel of the plurality of pixels comprises a plurality of sub-pixels of N number of colors, each sub-pixel of the plurality of sub-pixels of the plurality of pixels comprises an organic light emitting diode, and all sub-pixels of an $i^{th}$ color of the plurality of sub-pixels of the plurality of pixels are connected in parallel, wherein 1≤i≤N and N is an integer greater than 1; and
      N number of driving circuits disposed in a second region of the display structure, wherein an $i^{th}$ driving circuit of the N number of driving circuits is configured to drive all of the sub-pixels of the $i^{th}$ color of the plurality of sub-pixels of the plurality of pixels, in the first region,
   wherein each of the N number of driving circuits comprises a driving transistor,
   wherein the organic light emitting diode of each of the plurality of sub-pixels of the plurality of pixels comprises a first electrode, a second electrode, and an organic light emitting layer disposed between the first electrode and the second electrode,
   wherein the driving transistor of the $i^{th}$ driving circuit is connected to the first electrodes of the organic light emitting diodes of all of the sub-pixels of the $i^{th}$ color of the plurality of sub-pixels of the plurality of pixels,
   wherein the organic light emitting diode is transparent, the first region and the second region do not overlap, and the first region does not contain any one of the driving circuits, such that the first region is wholly transparent,
   wherein the display panel further comprises an effective light emitting region comprising a plurality of effective light emitting pixels and a plurality of corresponding driving circuits disposed in the effective light emitting region, wherein each of the plurality of effective light emitting pixels includes a plurality of sub-pixels, and each of the plurality of sub-pixels in the effective light emitting region corresponds to a respective one of the plurality of corresponding driving circuits, and wherein the display device further comprises an image acquisition device disposed in the first region and located on a side of the display structure away from a light exiting direction.

7. The display device according to claim 6, further comprising:

a sensor disposed in the first region and located on the side of the display structure away from the light exiting direction.

* * * * *